(12) United States Patent
Wang et al.

(10) Patent No.: US 8,203,154 B2
(45) Date of Patent: *Jun. 19, 2012

(54) STACKED SWITCHABLE ELEMENT AND DIODE COMBINATION WITH A LOW BREAKDOWN SWITCHABLE ELEMENT

(75) Inventors: Qi Wang, Littleton, CO (US); James Scott Ward, Englewood, CO (US); Jian Hu, Englewood, CO (US); Howard M. Branz, Boulder, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 1289 days.

This patent is subject to a terminal disclaimer.

(21) Appl. No.: 10/555,766

(22) PCT Filed: May 8, 2003

(86) PCT No.: PCT/US03/14268
§ 371 (c)(1),
(2), (4) Date: Nov. 3, 2005

(87) PCT Pub. No.: WO2004/107456
PCT Pub. Date: Dec. 9, 2004

(65) Prior Publication Data
US 2008/0116540 A1    May 22, 2008

Related U.S. Application Data

(63) Continuation-in-part of application No. PCT/US01/32380, filed on Oct. 16, 2001, and a continuation-in-part of application No. 10/240,838, filed on Feb. 11, 2003, now Pat. No. 7,067,850.

(51) Int. Cl.
*H01L 29/161* (2006.01)
*H01L 29/00* (2006.01)

(52) U.S. Cl. .......................................... 257/84; 257/530

(58) Field of Classification Search .................. 257/84, 257/80, 103, 107, 530, E27.004, 85
See application file for complete search history.

(56) References Cited

U.S. PATENT DOCUMENTS

| | | | |
|---|---|---|---|
| 4,684,972 A | 8/1987 | Owens et al. | |
| 4,696,093 A | 9/1987 | Welch | |
| 5,081,066 A | 1/1992 | Kim | |
| 5,155,565 A | 10/1992 | Wenz et al. | |
| 5,360,981 A | 11/1994 | Owens et al. | |
| 5,663,580 A * | 9/1997 | Harris et al. | 257/77 |
| 6,054,747 A | 4/2000 | Fang et al. | |
| 7,038,248 B2 * | 5/2006 | Lee | 257/104 |
| 7,067,850 B2 * | 6/2006 | Branz et al. | 257/103 |
| 2002/0066904 A1 | 6/2002 | Yuan et al. | |

OTHER PUBLICATIONS

International Preliminary Examination Report dated Jun. 23, 2008, for International Application No. PCT/US03/14268.

* cited by examiner

*Primary Examiner* — Hung Vu
(74) *Attorney, Agent, or Firm* — Cynthia S. Mitchell; Paul J. White; John C. Stolpa

(57) ABSTRACT

A device (10) comprises a semiconductor diode (12) and a switchable element (14) positioned in stacked adjacent relationship. The semiconductor diode (12) and the switchable element (14) are electrically connected in series with one another. The switchable element (14) is switchable from a low-conductance state to a high-conductance state in response to the application of a low-density forming current and/or a low voltage.

20 Claims, 7 Drawing Sheets

US 8,203,154 B2

STACKED SWITCHABLE ELEMENT AND DIODE COMBINATION WITH A LOW BREAKDOWN SWITCHABLE ELEMENT

RELATED APPLICATION

This is a continuation-in-part of PCT Patent Application PCT/US01/32380, filed Oct. 16, 2001, and U.S. patent application Ser. No. 10/240,838, filed Jul. 31, 2002, hereby incorporated herein for all that it discloses.

CONTRACTUAL ORIGIN OF THE INVENTION

The United States Government has rights in this invention pursuant to Contract No. DE-AC36-99GO10337 between the U.S. Department of Energy and the Midwest Research Institute.

TECHNICAL FIELD

This invention relates to integrated circuit devices in general and more specifically to a switchable element and diode combination embodied in a stacked structure.

BACKGROUND ART

Semiconductor devices are well-known in the art and have been used for decades in electronic systems to perform a wide variety of tasks. While many different types of semiconductor devices exist and are being used, most involve the transport of charge carriers (e.g., electrons) across one or more junctions or interfaces formed within the semiconductor material. The junctions typically involve an interface between two different types of semiconductor material, such as p-type and n-type material, although other types of semiconductor materials may also be used. In this manner, a wide range of semiconductor devices, such as diodes, transistors, and silicon controlled rectifiers, having a wide range of functions and operating characteristics may be formed from semiconducting materials. Commonly used semiconductor materials include, but are not limited to, silicon, gallium arsenide, aluminum gallium arsenide, and gallium arsenide indium phosphide.

Because of the wide range of devices, functions, and operating characteristics that may be created with such semiconducting materials, new devices and uses for semiconducting materials are still being developed, even today. Often, such newly developed devices prove to be significant improvements over earlier devices, either in terms of performance, size, or some combination of the two. Unfortunately, however, such new devices often carry certain disadvantages, such as requiring additional manufacturing steps, or requiring enhanced lithography or forming techniques. As a result, such newly developed semiconductor devices often involve a balance between improved performance and increased difficulty of manufacture. Accordingly, any semiconductor device having improved performance and/or reduced size while at the same time involving simplified or reduced-cost manufacturing will represent a significant improvement in the state of the art.

DISCLOSURE OF INVENTION

A device according to the present invention may comprise a semiconductor diode and a switchable element positioned in stacked adjacent relationship so that the semiconductor diode and the switchable element are electrically connected in series with one another. The switchable element is switchable from a low-conductance state to a high-conductance state in response to the application of a low-density forming current.

Also disclosed is a method of forming a device that comprises the steps of: forming a diode device from semiconducting material; forming a dielectric intermediate layer in stacked adjacent relationship with the diode device; and depositing a metallic layer on the dielectric intermediate layer, the dielectric intermediate layer and the metallic layer forming a switchable element, the switchable element being switchable from a low-conductance state to a high-conductance state in response to the application of a low-density forming current to the switchable element, the switchable element being in electrical series with the diode device.

BRIEF DESCRIPTION OF THE DRAWINGS

Illustrative and presently preferred embodiments of the invention are shown in the accompanying drawings in which.

BEST MODES FOR CARRYING OUT THE INVENTION

Figure 1:
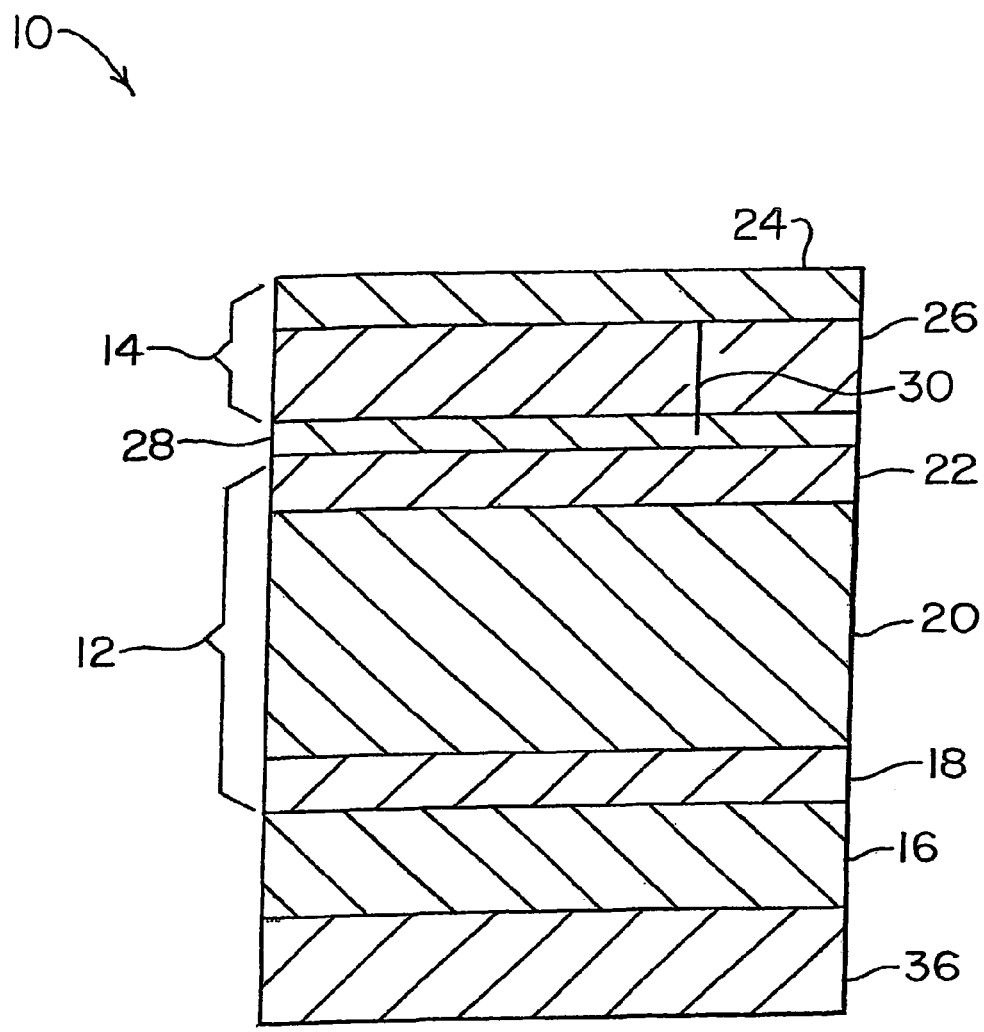
FIG. 1 is a schematic sectional view of a first embodiment of a device according to the present invention.

A device 10 according to one embodiment of the invention is shown in FIG. 1 and may comprise a semiconductor diode device 12 and a switchable element 14 positioned in stacked adjacent relationship so that the semiconductor diode 12 and switchable element 14 are electrically connected in series. As will be described in greater detail below, the switchable element 14 is initially in the low-conductance or "OFF" state and maybe switched to a high-conductance or "ON" state in response to the application of a low voltage and/or a low-density forming current to the switchable element 14. Stated another way, the forming current maybe used to "close" (i.e., place in the high-conductance or ON state) the switchable element 14. The series combination of the semiconductor diode 12 and switchable element 14 allows the state (e.g., high- or low-conductance) of device 10 to be conveniently "written" and "sensed" or "read," thereby allowing the device 10 to be used in electronic memory systems.

With reference now specifically to FIG. 1, one embodiment 10 of the device according to the present invention may comprise a semiconductor diode device 12 in contact with an electrical contact 16. As will be discussed in greater detail below, the diode device 12 may comprise any of a wide range of structures and operating characteristics for semiconductor diodes that are now known in the art or that may be developed in the future. By way of example, in the embodiment shown and described in FIG. 1 the semiconductor diode device 12 may comprise an n+-i-p device having a highly doped n-type (i.e., n+) layer 18, an intrinsic or lightly doped layer 20, and a p-type (i.e., p) layer 22. All three layers 18, 20, and 22 may be fabricated from microcrystalline silicon, although amorphous silicon may also be used. The contact 16 may comprise Cr, Pd, Al, or other metal, as will be described in greater detail below.

The switchable element 14 may comprise a metal layer 24 and an intermediate layer 26 in positioned stacked adjacent relationship with the diode device 12. The arrangement is such that the switchable element 14 is electrically connected in series with the diode device 12. Stated another way, the diode device 12 and switchable element 14 comprise a monolithic, series-connected stack. The metal layer 24 of switchable element 14 may comprise silver, although other metals may be used. The intermediate layer 26 may comprise either an intrinsic semiconducting layer, a p-type semiconducting layer, or some combination of intrinsic and p-type semiconducting material. Alternatively, the intermediate layer 26 may comprise an insulator, such as a polymer material, as will be described in greater detail below. In one preferred embodiment, the intermediate layer 26 comprises p-type amorphous silicon passivated with hydrogen (i.e., p-a-Si:H). In another preferred embodiment, the intermediate layer 26 comprises a dielectric material (e.g., $SiO_x$, $MgF_2$, silicon-rich SiN, or microcrystal silicon), although other materials may also be used. It is noted that the term microcrystal silicon, as it is understood in the art, is a thin-film silicon material comprised of crystallites which may range in size from 10 nm to 10 µm and may include amorphous silicon tissues between the crystallites. The term microcrystal silicon includes both nano-size and micron-size material.

As will be described in greater detail below, it is generally preferred, but not required, that a stop layer 28 be formed or positioned between the semiconductor diode device 12 and the switchable element 14. The stop layer 28 helps to prevent the diode device 12 from being damaged (e.g., shorted) during the application of the forming current to the switchable element 14. In one embodiment, the stop layer 28 may comprise a metallic or an extremely thin insulating layer. Alternatively, the stop layer 28 may comprise an appropriately doped and passivated amorphous silicon material. Still other materials may also be used for the stop layer 28, as will be described in greater detail below.

The diode portion 12, switchable element portion 14, and optional stop layer 28 of device 10 may be fabricated in accordance with any of a wide variety of processes that are well-known in the art or that may be developed in the future that are, or would be suitable for fabricating the various layers comprising each portion 12, 14, and 28. Consequently, the present invention should not be regarded as limited to any particular fabrication processes or techniques to fabricate the device 10. However, by way of example, one or more of the various layers of the device may be fabricated by chemical vapor deposition (CVD) (e.g., hot-wire CVD or plasma-enhanced CVD), spin-depositing techniques, or electron beam deposition.

As mentioned above, the switchable element 14 is initially in the low-conductance or OFF state, but may be placed in the high-conductance or ON state in response to the application of a forming current to the switchable element 14. Consequently, the switchable element 14 functions like an "antifuse" in that it closes or becomes more conductive after the application of a low voltage and/or low-density forming current. This is in contrast to a conventional fuse which opens in response to the application to the fuse of an excessive current.

When the switchable element 14 is in the low-conductance or OFF state, the impedance of the switchable element is relatively high (e.g., typically on the order of tens to hundreds of megaohms (MΩ) in one embodiment). When the switchable element is in the high-conductance or ON state, the impedance of the semiconductor switch 14 is several orders of magnitude lower than the impedance of the switchable element in the low-conductance state. For example, in one preferred embodiment, the impedance of the switchable element 14 is on the order of hundreds to thousands of ohms (Ω). As will be described in greater detail below, the absolute impedance of the switchable element 14 in either state is less important than is the magnitude of the impedance difference between the two states. That is, the difference in the impedances between the high- and low-conductance states should be sufficient to allow for the reliable determination of the state of the device 10.

When the switchable element 14 is first formed or fabricated it is in the low-conductance or OFF state. That is, the switchable element 14 has a relatively high impedance and passes very little current. The state of the switchable element 14 may be changed to the high-conductance or ON state by applying a low voltage and/or low-density forming current across the switchable element 14. For example, in one preferred embodiment, the switchable element 14 may be changed from the low-conductance or OFF state to the high-conductance or ON state by applying a forming current of sufficient magnitude and for sufficient time in the manner that will be described below. While the mechanisms responsible for causing the switchable element 14 to be switched from the low-conductance state to the high-conductance state are not yet well-understood, it is believed that the application of the forming current causes one or more conductive filaments (shown schematically in FIG. 1 at 30) to form or "grow" from the metal layer 24 through the intermediate layer 26. The filament or filaments 30 provide a conductive pathway through the intermediate layer 26 of switchable element 14.

The filament growth theory is supported by observations that if the forming current and time of application are not carefully controlled, the diode element 12 will become shorted. It is believed that such diode shorting is the result of continued filament growth through the diode element 12. Accordingly, it is generally preferred, although not required, to provide the stop layer 28 between the switchable element 14 and the diode element 12. The stop layer 28 reduces the likelihood that the diode element 12 will become shorted during the forming process. Applying a low-voltage and/or a low-density forming current also reduces the likelihood that the diode element 12 will become shorted. Therefore, it is preferable that the type and thickness of material used for the intermediate layer 26 of the switchable element 14 be such that it breaks down with the application of a low current density and/or low voltage. Exemplary embodiments will be described in further detail below.

The device 10 may be written to as follows. Assuming that the device 10 has been fabricated in the manner briefly described above, the switchable element 14 will be in the low-conductance or OFF state. That is, the device 10 will act electrically in a manner akin to an open circuit, with little current flowing in response to the application of a potential voltage across the series combination of the diode 12 and switch 14. That is, the device 10 will have a current-voltage characteristic substantially as shown by curve 32 in FIG. 2. Of course, the device 10 may be utilized in this state, if desired. For example, if the device 10 comprises an individual cell or element of an electronic memory array, the low-conductance state may be made to correspond to a selected binary state (e.g., 0 or 1), as the case may be.

If it is desired to change the state of the device 10, a forming current can be applied across the series combination of the diode 12 and switch element 14. The polarity of the forming current is such that the diode element 12 of device 10 is biased in the forward direction. The application of the forming current causes the switchable element 14 of the device 10 to change to the high-conductance or ON state. In the high-conductance state, the device 10 will have a current-voltage characteristic substantially as shown by curve 34 in FIG. 2. The curve 34 is similar to the electrical characteristics of the diode element 12, since the switchable element 14 is relatively conductive. Accordingly, the state of the device 10 can be detected or "read" by forward biasing the diode element 12. If the diode element 12 conducts (i.e., passes current) then the switchable element 14 is in the high-conductance or ON state. If the device 10 comprises an individual cell or element of an electronic memory array, the high-conductance state may correspond to the other binary state (e.g., a 1 or a 0).

A significant advantage of the device 10 according to the present invention is that it provides a series combination of an electronic switch and diode in a stacked arrangement. Accordingly, the device 10 of the present invention eliminates the need to provide a lateral conduction path between the two devices, as would be required if the two devices were fabricated in side-by-side (as opposed to the stacked) relationship. As a result, the device 10 would readily lend itself to the simplified manufacture of high density memory arrays, since the lithography steps required to form a separate conductive path between the diode and switch may be eliminated.

Further advantages of the device 10 are realized when the intermediate layer 26 of the switchable element 14 is made of a material and of a suitable thickness so that it breaks down with the application of only a low current density and/or low voltage. Because the formed filamentary current path is microscopic in size (e.g., <1 micron in diameter), all of the switching current tends to be concentrated into a very small area of the diode, and is applied suddenly to the diode. This can cause local heating and metal diffusion, electromigration of metals, and/or carrier-induced degradation, any of which can create short-circuit paths that break down and damage the diode. By providing an intermediate layer 26 that breaks down with the application of low current densities and/or low voltage, the diode is more likely to survive the transition with its characteristics intact and remains useful in diode logic circuitry.

Having briefly described embodiment 10 of a device according to the present invention, as well as some of its more significant features and advantages, various preferred embodiments of the device will now be described in detail. However, before proceeding with the detailed description it should be noted that while the device 10 is shown and described herein as it may be used in a semiconductor memory array to store binary (i.e., two state) data, it is not limited to use in such applications. Indeed, since the device of the present invention is functionally similar to a switch and diode connected in series, the present invention may be used in any of a wide range of applications wherein such functionality is desired. Accordingly, the device of the present invention should not be regarded as limited to the particular applications shown and described herein.

With the foregoing considerations in mind, a first embodiment 10 of a device according to the present invention is illustrated in FIG. 1 and may comprise a semiconductor diode 12 and a switchable element 14 positioned in stacked adjacent relationship so that the semiconductor diode 12 and switchable element 14 form a monolithic, series-connected stack. The various elements (i.e., the semiconductor diode 12 and switchable element 14) comprising device 10 maybe fabricated to have any of a wide range of configurations or shapes depending on the requirements of the particular application. Consequently, the present invention should not be regarded as limited to a device 10 comprising any particular configuration or shape. However, by way of example, in one preferred embodiment, the device 10 is fabricated so that it has a generally square shape or configuration, with each side of the square having a length of about 10 micrometers (μm).

The semiconductor diode element 12 of the device 10 may comprise any of a wide range of diode types having any of a wide range of structures suitable for producing a diode device 12 having any of a wide range of electrical characteristics that would be required or desired for any particular application. For example, diode structures and types that may be used with the present invention include, but are not limited to, diodes comprising n-i-p structures or p-i-n structures. Diode structures involving conventional n-p or p-n structures can also be used, provided such diodes are fabricated from crystalline silicon or other crystal materials. Moreover, the diodes may be of any of a wide range of types, such as, for example, "conventional" rectifying diodes, Schottky diodes, tunnel diodes, or even light emitting diodes. Consequently, the present invention should not be regarded as limited to any particular diode structure having any particular electrical characteristics. However, by way of example, in the embodiment shown and described in FIG. 1, the semiconductor diode device 12 comprises an $n^+$-i-p device having a highly doped n-type layer 18, an intrinsic (or a very lightly doped) layer 20, and a p-type layer 22. All three layers 18, 20, and 22 are fabricated from microcrystalline silicon, although amorphous silicon may also be used.

The thicknesses of the various layers 18, 20, and 22 comprising diode device 12 are not particularly critical and may comprise any of a wide range of thicknesses depending on the electrical characteristics and other performance parameters that may be required or desired in any particular application. However, by way of example, in the embodiment shown and described herein, the $n^+$ layer 18 may have a thickness of about 60 nano-meters (nm), whereas the thicknesses of the intrinsic layer 20 and the p-layer 22 may be about 260 nm and 60 nm, respectively.

The layers 18, 20, and 22 comprising diode device 12 maybe formed by any of a wide range of processes that are now known in the art or that may be developed in the future that are or would be suitable for forming the layers 18, 20, and 22 to produce the diode device 12. Accordingly, the present invention should not be regarded as limited to any particular process for forming the various layers of the diode device 12. However, by way of example, in one preferred embodiment, the various layers 18, 20, and 22 of diode device 12 are formed by chemical vapor deposition.

The diode device 12 maybe provided with a suitable electrical contact, such as contact 16, to allow one of the electrodes (i.e., either the anode or the cathode, as the case maybe) of the diode device 12 to be electrically connected to an external circuit and/or device. In the embodiment shown and described herein, the contact 16 contacts the cathode (i.e., $n^+$ layer 18) of diode device 12. The contact 16 may comprise any of a wide range of materials (e.g., metals or doped semiconductors) that would be suitable for the intended application. Also, any of a wide range of interface layers (e.g., doped semiconducting layers) may be positioned between the diode 12 and the contact 16 if required or desired for the particular application. Consequently, the present invention should not be regarded as limited to contacts comprising any particular material or to the presence or absence of any interface layers or material between the diode 12 and the contact 16. However, by way of example, in one preferred embodiment, the contact 16 comprises stainless steel. Alternatively, other materials, such as aluminum, may also be used, as would be obvious to persons having ordinary skill in the art after having become familiar with the teachings of the present invention.

As mentioned above, the particular process used to form the diode device 12, as well as the exact compositions and structural characteristics of each of the various layers (e.g., 18, 20, and 22) of the diode device 12 are not particularly critical and may comprise any of a wide range of forming processes, compositions and structural characteristics that would be suitable for producing a diode device having any of a wide range of desired electrical characteristics. For example, certain electrical characteristics of diode devices that are dependent on such fabrication parameters (e.g., the forming processes, layer compositions and structural characteristics) include, but are not limited to forward turn-on voltage, forward series resistance, forward breakdown current, reverse breakdown voltage, reverse shunt resistance, and lateral resistance between elements. However, since the various fabrication parameters of the layers comprising the diode devices may be varied depending on the desired electrical characteristics of the diode device 12, and since persons having ordinary skill in the art could readily select such fabrication parameters after selecting the required or desired electrical characteristics of the diode device 12, the various fabrication parameters associated with the particular diode device 12 utilized in one preferred embodiment of the present invention will not be described in further detail herein.

The contact 16 may comprise the substrate itself which supports the device 10. Alternatively, the contact 16 may be supported by a separate, preferably insulating, substrate 36, such as glass, ceramic, plastic or other polymer, silicon, or even paper. See FIG. 1. Although in other embodiments, where substrate 36 may comprise a metal (e.g., foil or other metal sheet), contact 16 may be omitted. Also, any of a wide range of interface layers (not shown) may be positioned between the contact 16 and the substrate 36, as may be required or desired in the particular application. For example, in certain cases it maybe desirable to provide an interface layer or material between the contact 16 and the substrate 36 to provide for improved adhesion of the contact 16 to the substrate 36. The use of an insulating substrate 36 is advantageous if the device 10 comprises an individual cell or element in an array of cells, such as may be provided for in an electronic memory circuit. In such an application, an insulating substrate 36 provides a means for electrically insulating a contact 16 associated with a single "row" or "column" of cells (i.e., devices 10) from the contacts associated with adjacent rows or columns of cells.

The switchable element 14 may comprise any of a wide range of structures that are well-known in the art or that may be developed in the future capable of being switched between a non-conductive or "OFF" state and a conductive or "ON" state. For example, the switchable element 14 may comprise any of the structures and devices disclosed in U.S. Pat. No. 4,684,972 issued on Aug. 4, 1987, and entitled "Non-Volatile Amorphous Semiconductor Memory Device Utilizing a Forming Voltage" and U.S. Pat. No. 5,360,981, issued Nov. 1, 1994, and entitled "Amorphous Silicon Memory," both of which are hereby specifically incorporated herein by reference for all that they disclose.

In the embodiment shown in FIG. 1, the switchable element 14 may comprise a metal layer 24 and an intermediate layer 26 positioned in stacked adjacent relationship. The switchable element 14 may be positioned in stacked adjacent relationship with the diode device 12 so that the diode device 12 and switchable element 14 are electrically connected in series. As was mentioned above, the mechanism or mechanisms by which the switchable element 14 may be switched between at least two states (e.g., the ON state and the OFF state) are not well understood at this time. However, it is believed that the application of the forming current results in the formation or growth through the intermediate layer 26 of one or more filaments (represented schematically in FIG. 1 at 30) from the metal layer 24. This theory is supported by experimental evidence which indicates that certain metals for the metal contact 24 work better than others in causing the switchable element 14 to operate in either the conductive state or the non-conductive state. For example, Ag and V appear to diffuse easily through a semiconducting intermediate layer 26 comprising hydrogenated (i.e., passivated) amorphous silicon (a-Si:H) or a dielectric material, whereas Cr appears to be less likely to initiate metal diffusion through such a semiconducting intermediate layer 26. Consequently, it is generally preferable to fabricate the metal layer 24 from either Ag or V, especially where the intermediate layer 26 comprises a-Si:H or dielectric material.

The thickness of the metal layer 24 is not particularly critical, but should be sufficient to provide the required mechanical strength and durability that may be required or desired for the particular application. Consequently, the present invention should not be regarded as limited to a metal layer 24 having any particular thickness. However, by way of example, in one preferred embodiment, the metal layer 24 may have a thickness of about 60 nm. The metal layer 24 may be deposited by any of a wide variety of processes that are well-known in the art or that may be developed in the future that would be suitable for forming such metallic layers. By way of example, in one preferred embodiment, the metal layer 24 is formed by evaporation, although other processes (e.g., sputter deposition) may also be used.

The intermediate layer 26 may be deposited directly on the diode device 12 and may comprise either a semiconducting material or an insulating material. It will normally be best if the filament 30 grows through the layer 26 more readily than through the diode device 12. Alternatively, and as will be described in greater detail below a supplemental layer, such as a stop layer 28, may be formed between the intermediate layer 26 and the diode device 12.

The intermediate layer 26 may comprise any of a wide range of semiconducting materials, such as amorphous silicon passivated with hydrogen (a-Si:H) and may be either doped or undoped. In one of the embodiments shown and described herein, the intermediate layer 26 comprises p-type passivated amorphous silicon. Alternatively, the intermediate layer 26 may comprise intrinsic a-Si:H or even a p-i, p-i-n, or n-i-p structure of a-Si:H or of microcrystalline silicon. In addition, other materials, such as those described in U.S. Pat. Nos. 4,684,972 and 5,360,981, may also be used. In still another application, the intermediate layer 26 may comprise an insulating material (e.g., any of a wide range of polymers or other organic materials). Insulating materials that may be used include, but are not limited to alloys of hydrogen-passivated amorphous silicon with carbon or with germanium. Alternatively, microcrystalline silicon may also be used. The intermediate layer may also be formed from conventional photoresist films.

In other preferred embodiments, intermediate layer 26 may comprise a dielectric material. Exemplary materials include suitable spin-on glass (SOG) such as Silicafilm™ commercially available from Emulsitone Company (Whippany, N.J. 07981) or other spin-on dielectric $SiO_x$ film, $MgF_2$, silicon-rich SiN, and microcrystal silicon, to name only a few. Accordingly, the intermediate layer 26 readily breaks down when a low-density current and/or low voltage are applied to the switchable element.

The intermediate layer 26 may be deposited by any of a wide variety of processes that are well-known in the art or that may be developed in the future that would be suitable for forming an intermediate layer 26 comprising the desired material. The process which is utilized may depend on various design considerations, including but not limited to the type of material which is being deposited. By way of example, a semiconducting intermediate layer 26 may be formed by chemical vapor deposition (CVD). A silicon-rich SiN or microcrystal silicon intermediate layer 26 may be deposited using hot-wire CVD techniques, preferably at temperatures of less than about 160° C. A $MgF_2$ intermediate layer 26 may be deposited using electron beam deposition techniques at about room temperature. In another example, spin-on glass intermediate layer 26 may be deposited by spinning a $SiO_x$ film at about 4000 revolutions per minute (rpm) for about 30 seconds. The deposited $SiO_x$ may then be annealed for about 40 minutes at about 90° C.

Of course specific application parameters may vary based on design considerations such as the material and the desired thickness. In addition, it is understood that these processes are merely provided as exemplary of processes that may be used according to the teachings of the invention. Processes such as these are well-understood by those skilled in the art and therefore further description is not necessary for a full understanding of or to practice the invention.

The thickness of the intermediate layer 26 may be important depending on whether a supplemental layer, such as stop layer 28, is positioned between the switchable element 14 and the semiconductor diode device 12. Generally speaking, the thickness of intermediate layer 26 should be sufficient to prevent unintentional diffusion of the metal layer 24 through the intermediate layer 26. Such unintentional diffusion may cause the switchable element 14 to change from the low-conductance to the high-conductance state. However, the thickness of the intermediate layer 26 should not be so great that it is difficult to intentionally change the state of the switchable element 14 in response to the forming current.

In accordance with the foregoing considerations, we have found that a semiconducting intermediate layer 26 generally having a thickness in the range of about 10 nm to about 500 nm (100 nm preferred) provides good results. We have also found that the following thickness of intermediate layer 26 for different dielectric materials promote breakdown of the switchable element 14 with the application of a low voltage and/or low-density current: SOG (about 100 nm to 2 μm thick), $MgF_2$ (about 300 Å thick), silicon rich SiN (about 100-200 Å thick), and microcrystal silicon (about 350 Å). Other embodiments are also contemplated as being within the scope of the invention, as will become readily apparent to one skilled in the art after having become familiar with the teachings of the invention.

As was described above, it is generally preferred, but not required, to position a stop layer 28 between the intermediate layer 26 of switchable element 14 and the diode 12. The stop layer 28 reduces the likelihood that the diode device 12 will be shorted during the application of the forming current to the switchable element 14. That is, in accordance with the theory that the switchable element 14 is made conductive due to the growth of one or more conductive filaments 30 through the intermediate layer 26, the presence of the stop layer 28 retards the growth of the filament 30 by an amount sufficient to allow the forming current to be removed before the filament contacts or grows through the diode device 12. Alternatively, and as will be described below, careful control of the forming current may allow the device 10 to be operated satisfactorily in the absence of a supplemental or stop layer 28. Certain variations in the materials and characteristics comprising the switchable element 14 may also allow the device 10 to be satisfactorily operated without a supplemental or stop layer 28.

In one preferred embodiment the stop layer 28 comprises a highly doped n-type semiconducting material, such as hydrogen passivated amorphous silicon. Alternatively, other materials, such as metals or thin insulating layers (e.g., silicon oxide or silicon nitride), may also be used in the manner that will be described in greater detail below. The stop layer 28 may be deposited by any of a wide variety of processes that are well-known in the art or that may be developed in the future that would be suitable for forming such semiconducting layers. By way of example, in one preferred embodiment, the stop layer 28 is formed by chemical vapor deposition, although other processes may also be used.

If the stop layer 28 comprises an insulating or undoped semiconducting material then the thickness of the stop layer should be carefully controlled. For example, thin stop layers 28 may reduce the ability to reliably stop filament growth (e.g, by removing the forming current) before the filament 30 shorts the diode device 12. On the other hand, excessive thickness of an insulating stop layer 28 may impede the flow of current between the switchable element 14 and the diode 12, thereby making it difficult to read the state of the switch device 14. In this regard it is believed that the growth of the filament 30 should be terminated at a position within an insulating stop layer 28 that will allow electrons to "tunnel" through the remaining thickness of the stop layer 28. Such a phenomenon is known in the art as "electron tunneling." In accordance with the foregoing considerations, then, we have determined that if the stop layer 28 comprises an insulator, it should have a thickness between about 0.5 nm and about 2 nm (1 nm preferred). Alternatively, of course, other thicknesses maybe used provided they allow the switchable element 14 to be reliably written without shorting the diode 12 while also allowing sufficient current flow through the junction from the switchable element 14 and to determine whether the switch device 12 is in the ON state or the OFF state.

As mentioned above, other materials may be used for the stop layer 28. For example, the stop layer 28 may also comprise a relatively "stable" metal (i.e., a metal having low diffusivity through the adjacent layers 22 and 26) such as Cr. A stop layer 28 comprising a metallic material functions in a manner similar to the semiconducting stop layer in that it allows the filament growth to be more easily terminated before the filament 30 contacts the diode device 12. Such a metallic stop layer may be fabricated in accordance with any of a wide range of processes that are now known in the art or that may be developed in the future that are or would be suitable for depositing metallic layers. Consequently, the present invention should not be regarded as limited to any particular fabrication process. However, by way of example, in one preferred embodiment, a metallic stop layer 28 may be formed by evaporation. Alternatively, other processes, such as sputter deposition, may also be used.

Because such a metallic stop layer 28 is highly electrically conductive, it removes the concern of providing a low resistance path (such as by electron tunneling in the case of an insulating stop layer 28) between the filament 30 and the diode device 12. Consequently, a stop layer 28 fabricated from metal may be made thicker, if desired (compared with an insulating stop layer), in order to provide an enhanced margin against diode shorting by filament impingement. However, a metallic stop layer 28 would need to be patterned (e.g., by means of lithography) if the device 10 is to comprise an individual cell or element of an array of devices 10. A patterned metallic stop layer 28 is required in such an application in order to prevent the metallic stop layer 28 from shorting out other memory cells in the array. In contrast, a stop layer 28 comprising a semiconducting material, such as thin $n^+$-a-Si:H or an insulating stop layer, such as $SiN_x$, will not usually need to be patterned in such an application. That is, the higher electrical resistance of a semiconducting stop layer is usually sufficient to prevent shorting and/or unacceptable cross-talk between adjacent memory cells. Accordingly, it is generally advantageous to fabricate the stop layer 28 from a semiconducting material (e.g., $n^+$-a-Si:H) or an insulating material if the device 10 is to be used in an electronic memory array.

Figure 2:
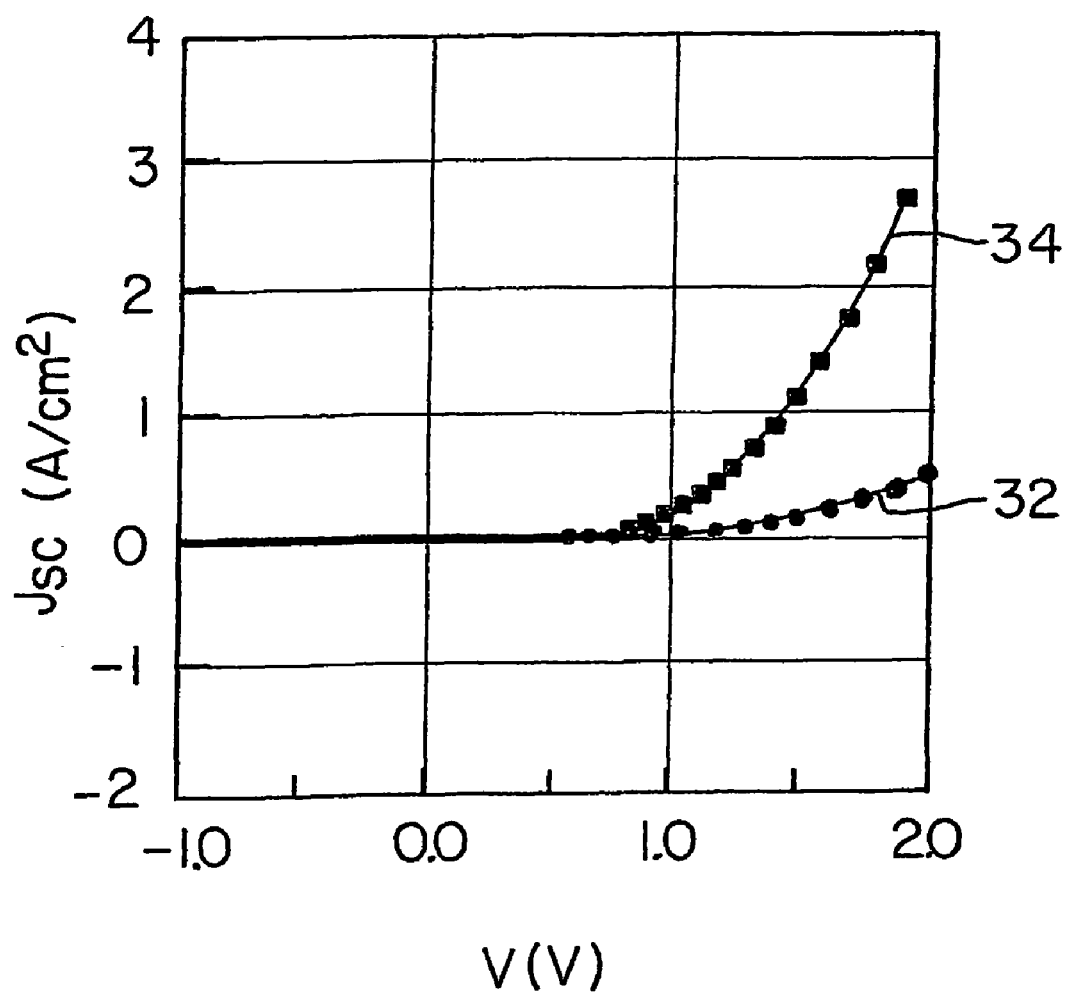
FIG. 2 illustrates current density/voltage curves of an unformed device and a formed device.
Figure 3A:
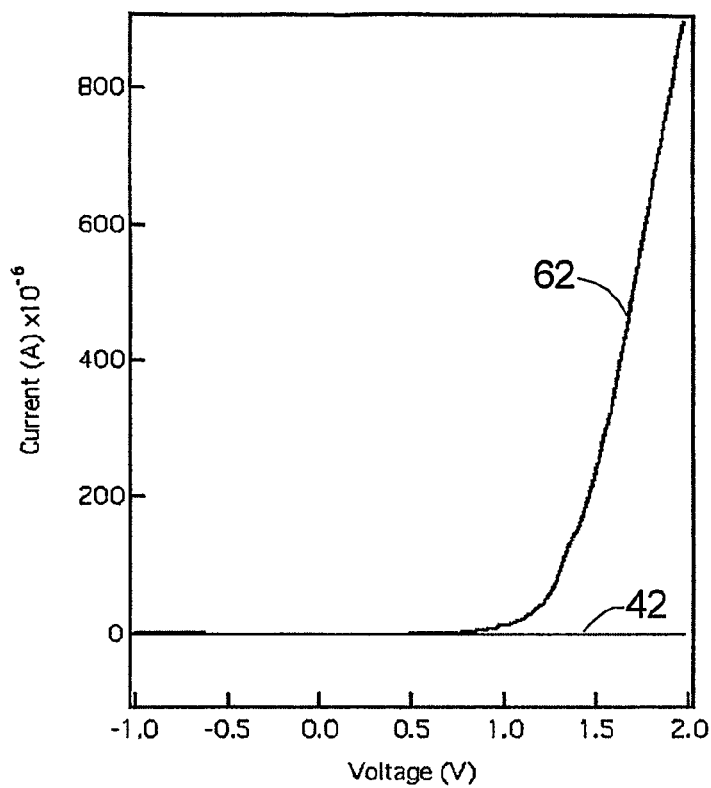
FIGS. 3(a) and 3(b) illustrate current/voltage curves of an unformed SOG device and a formed SOG device, wherein (a) is a linear plot and (b) is a semi-logarithmic plot.
Figure 3B:
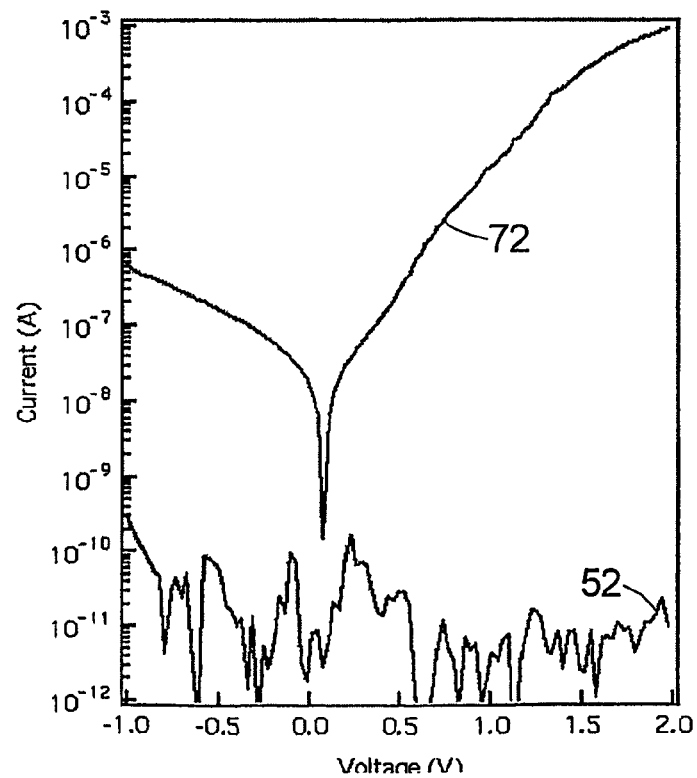
Figure 4A:
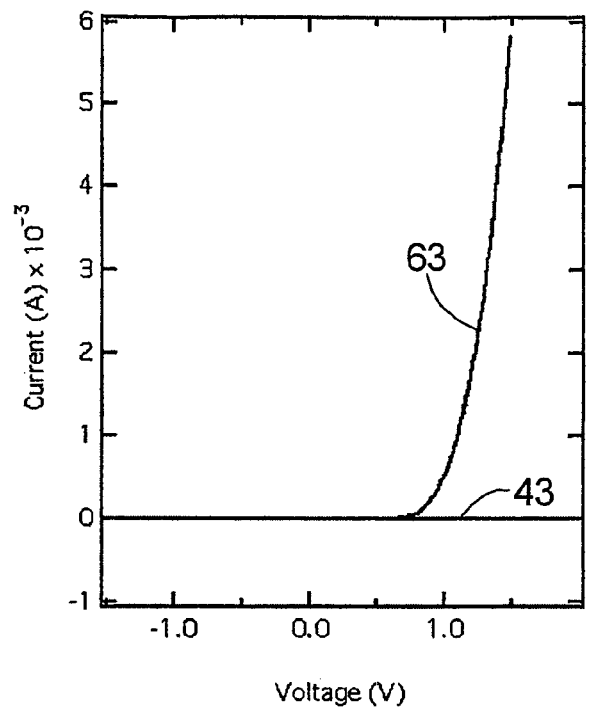
FIGS. 4(a) and 4(b) illustrate current voltage curves of an unformed microcrystal silicon device and a formed microcrystal silicon device, wherein (a) is a linear plot and (b) is a semi-logarithmic plot.
Figure 4B:
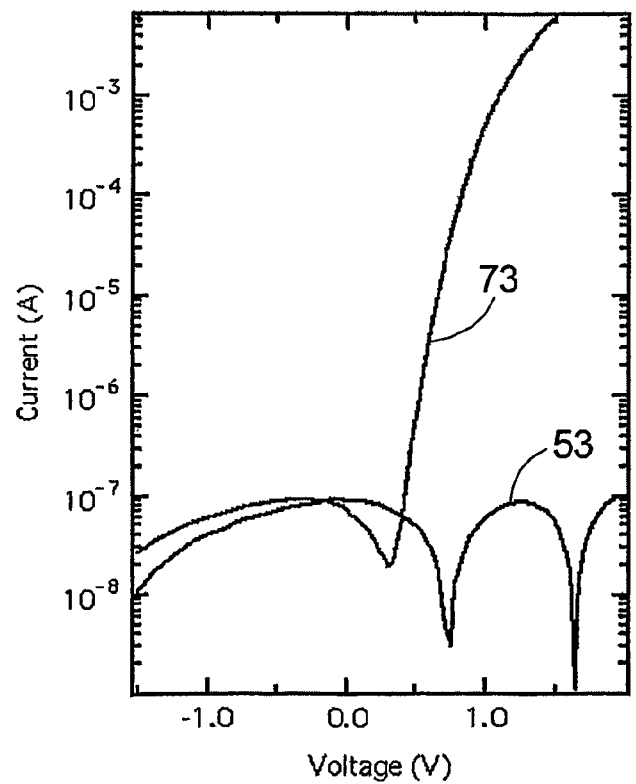
Figure 5A:
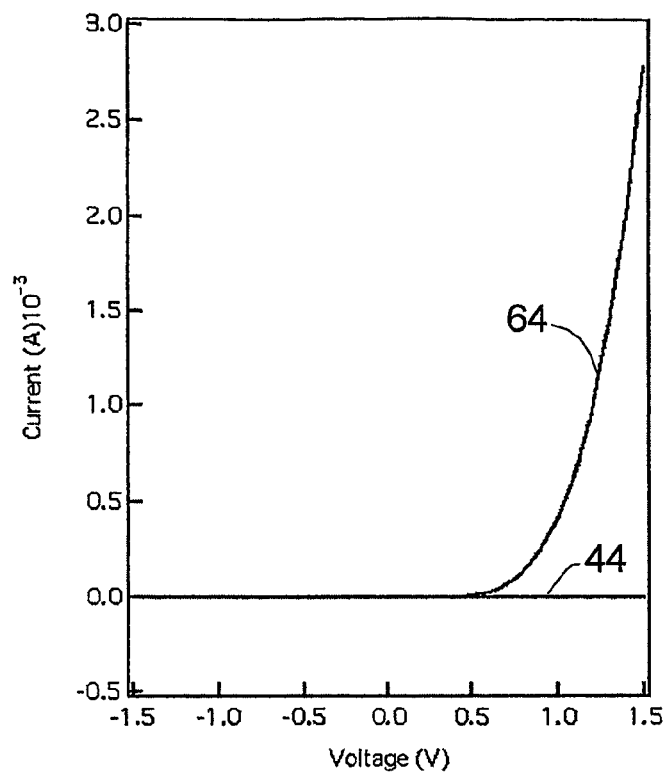
FIGS. 5(a) and 5(b) illustrate current/voltage curves of an unformed $MgF_2$ device and a formed $MgF_2$ device, wherein (a) is a linear plot and (b) is a semi-logarithmic plot.
Figure 5B:
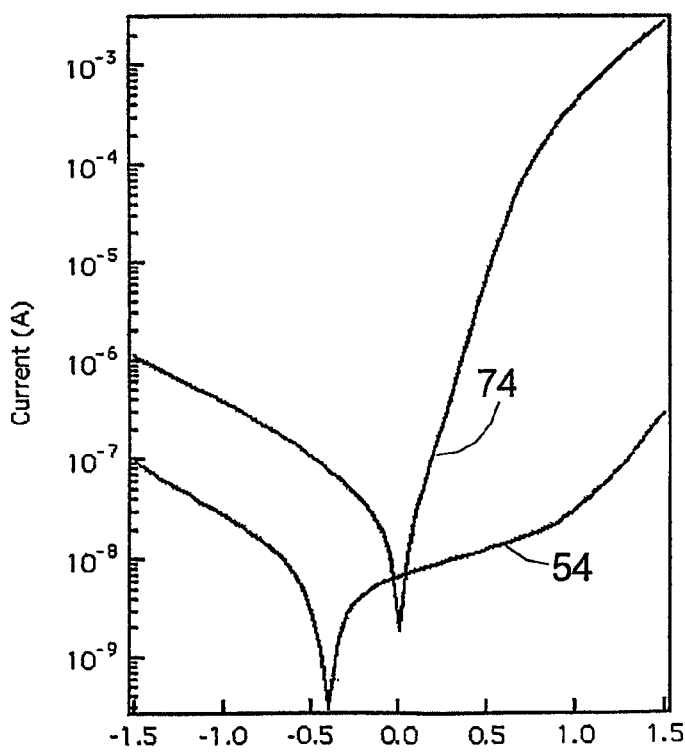
Figure 6A:
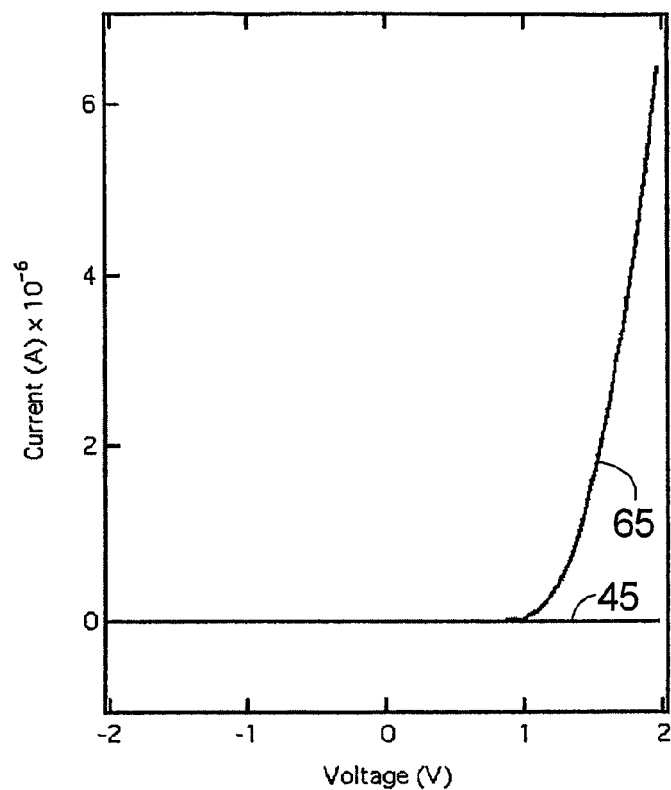
FIGS. 6(a) and 6(b) illustrate current/voltage curves of an unformed SiN device and a formed SiN device, wherein (a) is a linear plot and (b) is a semi-logarithmic plot.
Figure 6B:
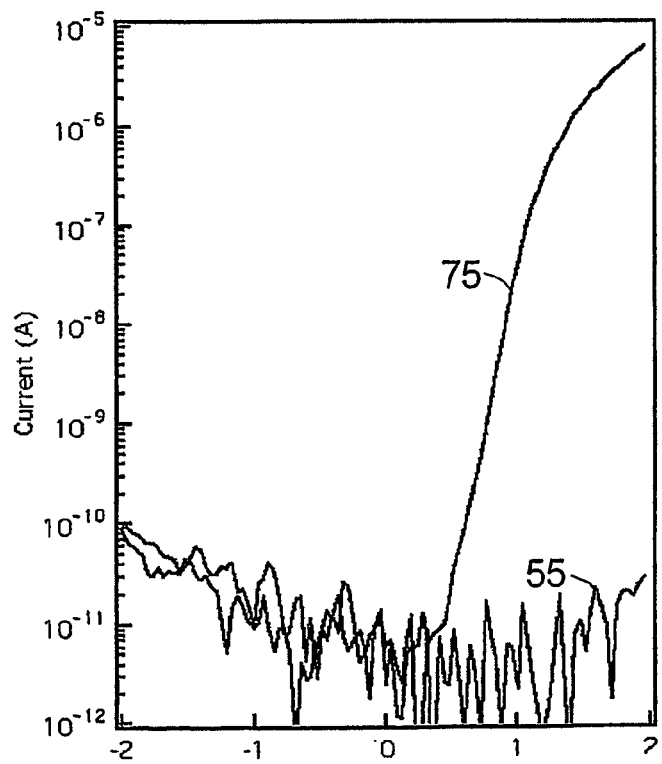

When the device 10 is first formed or fabricated, the switchable element 14 is in the low-conductance or OFF state and will have a current-voltage characteristic substantially as shown by curve 32 in FIG. 2. The low-conductance or OFF state (e.g., "before") is also shown by curves 42 and 52 in FIGS. 3(a) and 3(b), respectively using SOG as the intermediate layer 26 of the switchable element 14 (i.e., SS/nip/SOG/Ag probe). "Before" curves 43 and 53 are shown in FIGS. 4(a) and 4(b) for a microcrystal silicon intermediate layer 26 (i.e., Cr/diode/microcrystal silicon/Ag probe). "Before" curves 44 and 54 are shown in FIGS. 5(a) and 5(b) for an $MgF_2$ intermediate layer 26 (i.e., Cr/diode/$MgF_2$/Ag probe). "Before" curves 45 and 55 are shown in FIGS. 6(a) and 6(b) for a SiN intermediate layer 26 (i.e., Cr/diode/SiN/Ag probe).

In this state, the switchable element 14 has a relatively high impedance and passes very little current, much like an open switch. If it is desired to change the state of the device 10, a low-density forming current can be applied across the series combination of the diode 12 and switchable element 14. The current density is the current applied over an area of about 1 $\mu m^2$. The polarity of the forming current is such that the diode element 12 of device 10 is biased in the forward direction.

The application of the forming current causes the switchable element 14 to change to the high-conductance or ON state. In the ON state, the device 10 will have a current-voltage characteristic substantially as shown by curve 34 in FIG. 2. The low-conductance or ON state is also shown by "after" curves 62 and 72 in FIGS. 3(a) and 3(b); "After" curves 63 and 73 are shown in FIGS. 4(a) and 4(b); "After" curves 64 and 74 are shown in FIGS. 5(a) and 5 (b); "After" curves 65 and 75 are shown in FIGS. 6(a) and 6(b); each for the intermediate layers 26 made from the respective materials discussed above. The curves corresponding to the high-conductance or ON state (e.g., "after") of switchable element 14 are similar to the electrical characteristics of the diode element 12 by itself.

The magnitude and duration of the forming current required to change the state of the switchable element 14 may vary depending on the particular materials used to form the device 10. Consequently, the present invention should not be regarded as limited to forming currents of any particular magnitudes, voltages, and durations. However, by way of example, in one preferred embodiment a low density forming current may have a magnitude in the range of about 0.1 micro-amperes ($\mu A$) to about 10 $\mu A$ (1 $\mu A$ or less being preferred) applied over an area of about 1 square micrometer ($\mu m^2$), and a low voltage maybe in the range of about 1 to 3 volts (with less than 2 volts being preferred). The forming current may be applied for durations in the range of about 1 nano-second (ns) to about 1 second, with faster times being preferable. Alternatively, the forming processes may correspond to those disclosed in U.S. Pat. Nos. 4,684,972 and 5,360,981 if the switchable element 14 is fabricated in accordance with the teachings contained therein.

External electronic circuitry (not shown) connected to the device 10 can be made to recognize or differentiate between the changed current-voltage characteristics (i.e., I-V curves 32 and 34) of the device 10, thus determine whether the switchable element 14 is in the ON or OFF state. For example, if the device 10 comprises one element in an array of such elements, such as maybe the case if the device 10 comprises a portion of an electronic memory array, any element (e.g., device 10) in the array may be "read" by forward biasing the diode device 12 associated with desired element while reverse biasing the diodes associated with the other elements in the array. If the element conducts (i.e., passes current), then the element is in the high-conductance or ON state. This may be made to correspond to one of the states (e.g., "0" or "1") in a binary system.

Figure 7:
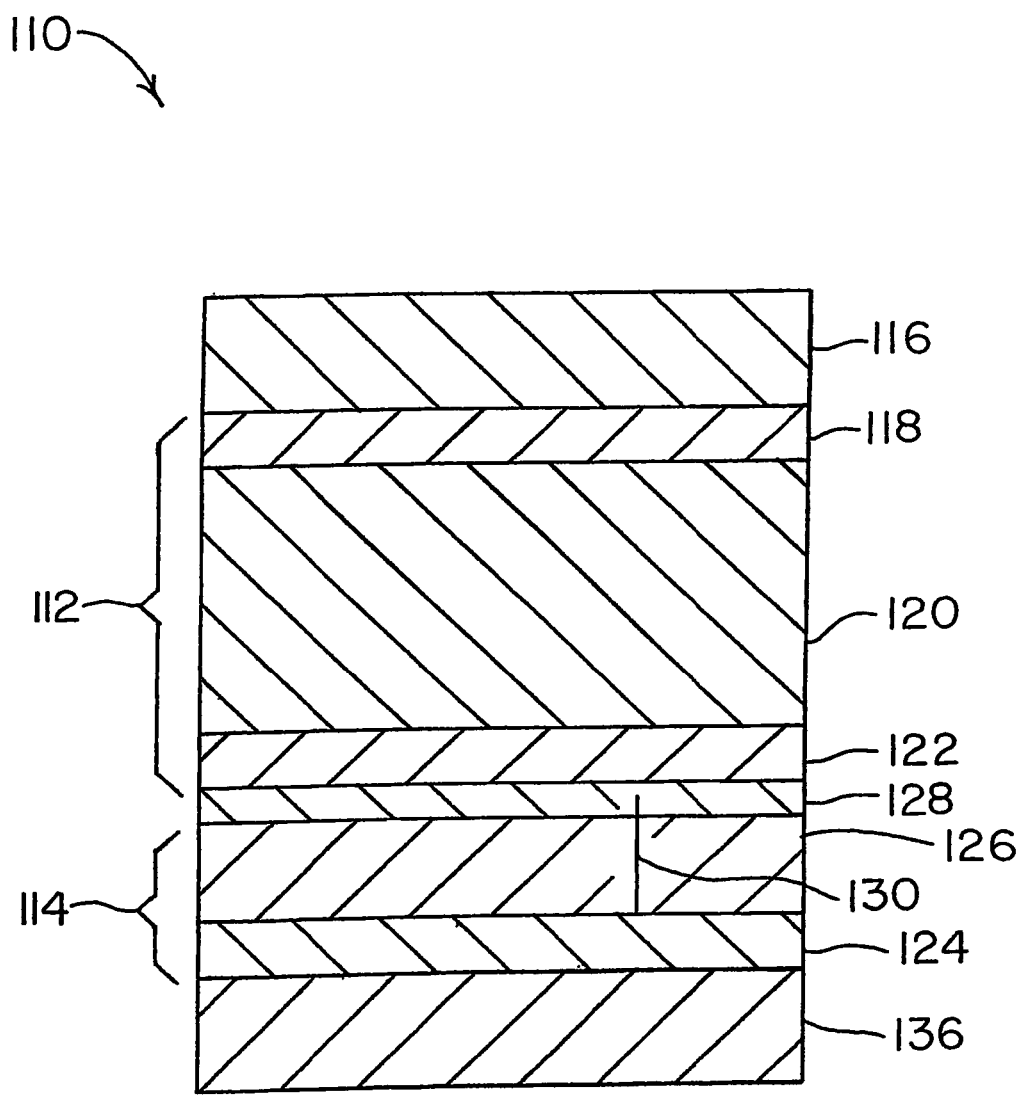
FIG. 7 is a schematic sectional view of a second embodiment of a device according to the present invention.

A second embodiment 110 of a device according to the present invention is illustrated in FIG. 7. The second embodiment 110 is similar to the first embodiment 10 described above except that the positions of the diode device 112 and the switchable element 114 are reversed. That is, the switchable element 114 is positioned adjacent a supporting substrate 136 with the diode device 112 in stacked adjacent relationship with the switchable element 112 so that the two devices form a monolithic, series-connected stack.

As was the case for the first embodiment 10, the diode device 112 of the second embodiment 110 may comprise any of a wide range of structures and materials to provide any required or desired diode characteristic. For example, in the embodiment shown in FIG. 7, the diode device 112 comprises a $p$-$i$-$n^+$ device having a p-type layer 122, an intrinsic layer 120, and a highly doped n-type layer 118. All three layers 118, 120, and 122 are fabricated from microcrystalline silicon, although amorphous silicon may also be used. A contact 116 may be formed adjacent the $n^+$ layer 118.

The switchable element 114 may comprise any of the materials recited above for the switchable element 14 for the first embodiment 10 and may be fabricated in accordance with the methods and considerations discussed herein. For example, the switchable element 114 may comprise a metal layer 124 and an intermediate layer 126 positioned in stacked adjacent relationship. The metal layer 124 may be fabricated on the support substrate 136.

The device 110 may be provided with a stop layer 128 or the stop layer 128 maybe omitted if the formation of the filament 130 can be reliably controlled in the manner already described to avoid shorting the diode element 112. If a, stop layer 128 is used, it may comprise either a semiconducting material (e.g., $n^+$-a-Si:H), an insulating material, or a metallic material, whichever may be more advantageous for the intended application.

It is contemplated that the inventive concepts herein described maybe variously otherwise embodied and it is intended that the appended claims be construed to include alternative embodiments of the invention except insofar as limited by the prior art.

The invention claimed is:
1. A device comprising:
a semiconductor diode; and
a switchable element comprising a metal layer, wherein the switchable element is positioned in stacked adjacent relationship to the semiconductor diode, wherein the semiconductor diode and the switchable element are electrically connected in series with one another, wherein the switchable element is configured to be switchable from a low conductance state to a high conductance state in response to the application of a low-density forming current.

2. The device of claim 1, wherein the switchable element comprises an intermediate layer of dielectric material adjacent to the metal layer.

3. The device of claim 2, wherein the intermediate layer comprises about 100 nm to about 2 μm of $SiO_x$.

4. The device of claim 2, wherein the intermediate layer comprises about 300 Å of $MgF_2$.

5. The device of claim 2, wherein the intermediate layer comprises between about 100 to 200 Å of silicon-rich SiN.

6. The device of claim 2, wherein the intermediate layer comprises about 350 Å of microcrystal silicon.

7. The device according to claim 1, further comprising a stop layer between the switchable element and the semiconductor diode.

8. The device according to claim 1, wherein the switchable element is configured to function as an anti-fuse.

9. A device comprising:
a semiconductor diode; and
a switchable element comprising a metal layer, wherein the switchable element is positioned in stacked adjacent relationship to the semiconductor diode, wherein the semiconductor diode and the switchable element are electrically connected in series with one another, wherein the switchable element is configured to be switchable from a low-conductance state to a high-conductance state in response to the application of a low-voltage.

10. The device of claim 9, wherein the switchable element comprises an intermediate layer of dielectric material adjacent to the metal layer.

11. The device of claim 10, wherein the intermediate layer comprises about 100 nm to about 2 μm of $SiO_x$.

12. The device of claim 10, wherein the intermediate layer comprises about 300 Å of $MgF_2$.

13. The device of claim 10, wherein the intermediate layer comprises between about 100 to 200 Å of silicon-rich SiN.

14. The device of claim 10, wherein the intermediate layer comprises about 350 Å of microcrystal silicon.

15. The device according to claim 9, further comprising a stop layer between the switchable element and the semiconductor diode.

16. The device according to claim 9, wherein the switchable element is configured to function as an anti-fuse.

17. A monolithic, stacked switchable element and diode device comprising:
a thin-film diode comprising a p type layer, an intrinsic or lightly doped layer, and a highly doped $n^+$ type layer;
a switchable element comprising a metal layer and an intermediate layer, wherein the intermediate layer of the switchable element is adjacent and substantially contiguous with the p type layer of the thin-film diode, wherein the thin-film diode and the switchable element are in a stacked physical arrangement and are electrically in series, wherein the switchable element is configured to be switchable from a low-conductance state to a high-conductance state in response to the application of a low-voltage or a low-density forming current; and
an electrical contact adjacent and substantially contiguous with the $n^+$ type layer of the thin-film diode.

18. The monolithic, stacked switchable element and diode device according to claim 17, wherein the thin-film diode comprises microcrystalline silicon or hydrogenated amorphous silicon (a-Si:H).

19. The monolithic, stacked switchable element and diode device according to claim 17, further comprising a stop layer between the intermediate layer of the switchable element and the p type layer of the thin-film diode, wherein the stop layer is configured to prevent the thin-film diode from being shorted during the application of a forming current to the switchable element.

20. The monolithic, stacked switchable element and diode device according to claim 17, wherein the metal layer of the switchable element comprises Ag or V.

* * * * *